United States Patent [19]
Redel

[11] 3,976,908
[45] Aug. 24, 1976

[54] ELECTRON BEAM GENERATOR WITH LINEAR CATHODE

[75] Inventor: Karl Georg Redel, Rodenbach, Germany

[73] Assignee: Leybold-Heraeus GmbH & Co. KG, Cologne, Germany

[22] Filed: Feb. 5, 1975

[21] Appl. No.: 547,117

[30] Foreign Application Priority Data
Mar. 2, 1974  Germany............................ 2410050

[52] U.S. Cl................................ 313/146; 313/446; 313/451; 313/459
[51] Int. Cl.² ...................... H01J 1/02; H01J 1/44; H01J 1/52; H01J 21/22
[58] Field of Search ........... 313/444, 445, 446, 447, 313/451, 459, 146

[56] References Cited
UNITED STATES PATENTS

| | | |
|---|---|---|
| 2,310,811 | 2/1943 | Schantl et al........................ 313/451 |
| 2,810,089 | 10/1957 | Mac Nair........................ 313/446 X |
| 3,192,301 | 6/1965 | Sterzl................... 313/146 |
| 3,816,790 | 6/1974 | Arakawa et al..................... 313/447 |

*Primary Examiner*—Saxfield Chatmon, Jr.
*Attorney, Agent, or Firm*—Joseph F. Padlon

[57] ABSTRACT

An electron beam generator with a linear cathode which has at least one end clamped to enable the cathode to move longitudinally. A beam forming electrode is at the same potential as the cathode and has an exit opening for the electron beam. The beam-forming electrode is provided with connection means to supply beam and heater voltage to the cathode. The clamps used to clamp the cathode, are connection contacts for the ends of the cathode and are outside of the contact points in the emission area of the cathode.

7 Claims, 5 Drawing Figures

U.S. Patent  Aug. 24, 1976  3,976,908
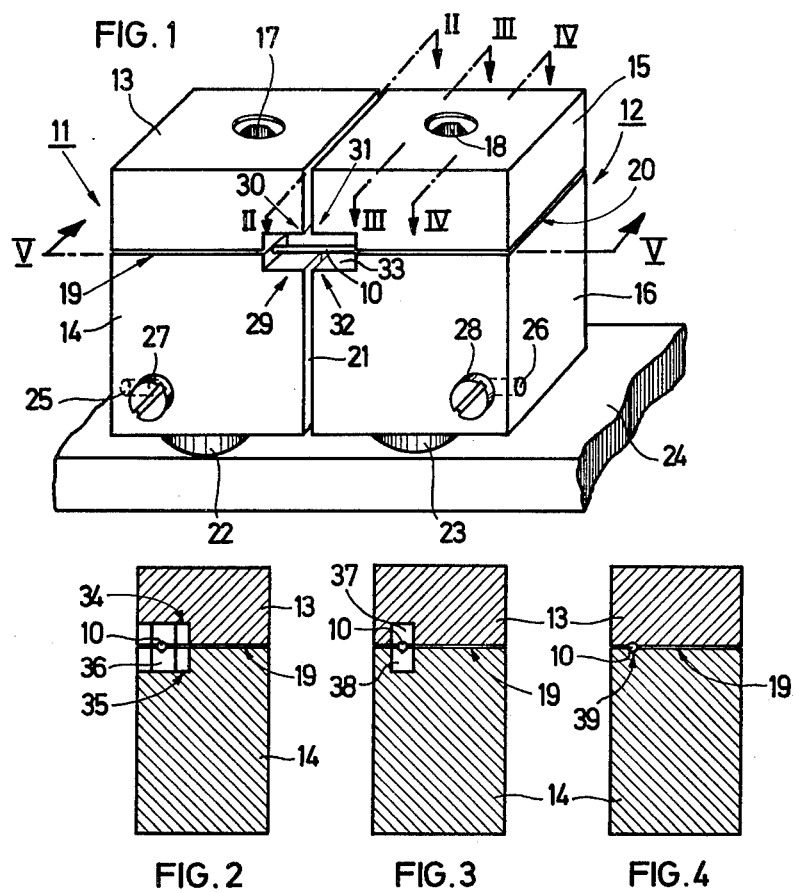
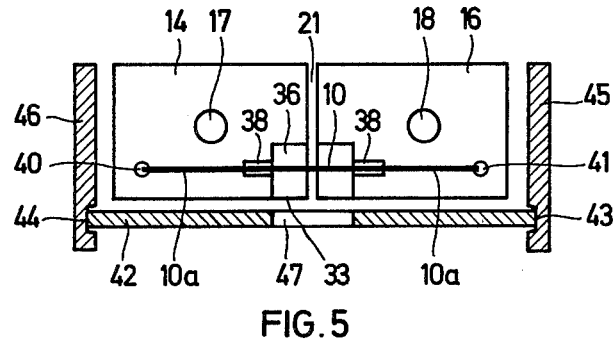

ELECTRON BEAM GENERATOR WITH LINEAR CATHODE

BACKGROUND OF THE INVENTION

The present invention relates to an electron beam generator with a linear cathode which is held in clamps on at least one end and is movable in a lengthwise direction. A beam-forming electrode is associated with the cathode and is at the same potential. Connections are provided for supplying beam and heater voltage to the cathode.

Linear cathodes with movable clamping for compensating longitudinal (lengthwise) expansion are known in the art (U.S. Pat. No. 3,286,117). However, with the known electron beam generator, cathode clamping, beam-forming electrode (Wehnelt electrode) and electrical connection contacts are separate from one another with respect to design and function. This requires a special effort for the fastening of the parts and results in insulation problems, especially because of unavoidable dirt accumulation. One must keep in mind that both the cathode and the beam-forming electrode are at high negative potential up to several 10,000 Volts, that a possible second accelerator is subject to the full potential difference, and that the two ends of the cathode are additionally loaded with a heater voltage whose difference is only a few volts. Hence the known approach does not permit extremely compact design. The current supply must be rigidly clamped to the cathode ends which is possible only because the cathode is bifilar, i.e. shaped like a hairpin. However, such a cathode shape cannot be considered for the generation of sharply focussed electron beams. Furthermore, the unavoidable cathode replacement involves several operating steps and adjustments.

With so-called small guns as used especially in electron beam evaporators, it has become customary to use cathodes consisting of a wire which is bent in a more or less complicated fashion. Here, however, close tolerances must be observed, since possible position deviations of the emitting part of the cathode lead in the beam-forming electrode to a displacement of the electron trajectories and hence of the beam impact point. The results are expensive production methods and adjustments to which must be added the resistance of the cathode material to deformation.

Accordingly, it is the object of the present invention to provide an electron beam generator of the type described initially, which has an extremely compact design, is easy to manufacture, and permits the use of stretched wire sections as cathode material without subsequent adjustments.

Another object of the present invention is to provide an electron beam generator of the foregoing species which is simple in design and highly reliable in operation.

A further object of the present invention is to provide a beam generator arrangement, as described, which may be easily fabricated and economically maintained in service.

SUMMARY OF THE INVENTION

The objects of the present invention are achieved as follows: The clamps for the cathode are designed as connection contacts for the cathode ends. Outside the contact points in the emission area of the cathode, the clamps are provided with recesses in such a way that a beam-forming electrode with an exit opening for the cathode beam is formed. Adhering to the principle of the present invention, the functions of cathode clamping, beam-forming electrode and contact points are combined so that there results an extremely simple design which permits simple manufacture and assembly. Basically, one can exclusively use parallelepiped-shaped parts which are provided only with small milled grooves. As cathode material one can use a completely stretched wire section, for example, made of tungsten. This design makes subsequent adjustment superfluous. The electron beam generator has a compact space-saving design which makes it particularly suitable for combination with evaporator crucibles for so-called small scale electron beam evaporators.

For the average specialist, the shape of the recesses for the beam-forming electrode is indicated by familiar considerations. The beam-forming electrode must develop the cathode on three sides of its periphery while the fourth side remains open to constitute a beam exit opening. Possibly required deviations from this shape can be easily determined by experiments.

The invention can be realized in a particularly simple manner as follows: The clamps consist each of two parallelepiped-shaped blocks, which can be braced relative to one another, and are combined into a closed body interrupted only by an insulating plane of separation. At least one of the blocks is provided at the clamping point of the cathode with a groove-like recess for accommodating the cathode end. The blocks are recessed at four corners facing one another in such a way that the recesses jointly constitute a Wehnelt electrode.

It is advantageous to locate the junctions in such a way that the planes of separation run horizontal between the blocks, and that the insulating plane of separation between the clamps is normal (at right angles) to the cathode in the center of its emission area, so that the individual blocks constitute quadrants. In accordance with its outer surface, the electron beam generator constitutes a parallelepiped which is divided by the above-mentioned planes of separation into four individual parallelepipeds.

Under the influence of thermal expansion, the cathode end can expand freely in the groove-like recesses in the plane of separation of the mutually braced blocks. Shape and depth of the groove-like recess is adapted to the cathode cross-section by making sure of a sufficient area of contact and contact pressure for transmitting the heater current without impeding the longitudinal expansion, so that the cathode bends sharply or buckles on the side. In order to prevent possible burrs at the cathode ends (arising from cutting with a tool) from preventing lengthwise expansion in the groove-like recess, it is further provided that the cross-section of the groove-like recesses is enlarged in the area of the cathode ends.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIG. 1 is a perspective view of a complete electron beam generator with the exception of the second accelerator;

FIG. 2 is a section taken along line II—II in FIG. 1;

FIG. 3 is a section taken along line III—III in FIG. 1;

FIG. 4 is a section taken along line IV—IV in FIG. 1; and

FIG. 5 is a section taken along line V—V in FIG. 1.

DESCRIPTION OF THE PREFERRED EMBODIMENTS

Referring to FIG. 1, a linear cathode 10 consists of a round tungsten wire. Only the emission area of the cathode is shown. The two ends of cathode 10 are held in clamping devices 11 or 12, which in turn consist of two parallelepiped shaped blocks 13 or 14, respectively, which can be braced relative to one another. The clamping is accomplished by means of set screws 17 and 18. The planes of separation 19 and 20, respectively, between the upper and lower blocks 13, 14 and 15, 16, run horizontal along the longitudinal axis of cathode 10.

The clamping devices 11 and 12 are separated by a vertical insulating plane 21 which runs normal to the axis of cathode 10. This plane consists of an air gap of approximately 0.5–1 mm in width. The metal clamping devices 11 and 12 brace each other through stringers (not shown). These stringers also serve as centering pins and prevent movement of the clamping devices relative to one another.

The clamping devices 11 and 12 are each fastened to a base plate 24 through a support insulator 22 and 23. The lower blocks 14 and 16 have a plug-in opening 25 and 26, respectively. Into each of these a setscrew 27 and 28 protrudes. The screws are used for fastening the electric conductors (not shown) for the required high voltage and the heater current.

The illustration in FIG. 1 shows that the body of the electron beam generator is divided by the planes of separation 19, 20 and the insulating plane 21 into four quadrants. At four corners 29, 30, 31 and 32 facing one another, the individual blocks are recessed in such a way that the recesses together constitute a Wehnelt electrode whose front side has an exit opening 33 for the electron beam formed.

FIG. 2 shows the cross-section of the beam-generating or Wehnelt electrode. The Wehnelt electrode is made up of the inner surfaces 34 and 35 of the recesses existing in all blocks 13 through 16. These recesses essentially constitute a parallelepiped-shaped recess 36 whose forward boundary plane is the exit opening 33 for the electron beam (FIG. 1). The axis of the cathode 10 lies approximately in the axis of symmetry of the parallelepiped-shaped recess 36.

FIG. 3 shows that the parallelepiped-shaped recess 36 in the direction of the ends of cathode 10 continues in the form of lateral pockets 37 and 38, without the exit opening 33 being extended to the end of the pockets. It is the purpose of this section to shift the temperature drop in the cathode through the relatively colder clamping away from the area of the Wehnelt electrode.

FIG. 4 shows the actual clamping place of the ends of the cathode 10 in the plane of separation 19. For the purpose of an accurate clamping and guidance of the cathode during the lengthwise expansion, there is provided in the lower block 16 of the clamping body 12, a groove-like recess 39 whose dimensions correspond in the manner described above to the cross-section of cathode 10.

In FIG. 5 the previous reference numerals are retained. One can see the completely stretched extent of the cathode 10 and the relatively long ends 10a of the cathode which pass through the recess 39 in accordance with FIG. 4. The cross-section of the groove-like recesses 39 is widened in the area of the cathode ends, by a bore 40 or 41 which is normal to the plane of the drawing. The cathode wire has a length such that each of both ends protrudes one to two millimeters beyond the cross-section of bores 40 and 41, respectively. After insertion into the groove-like recesses 39 in accordance with FIG. 4, blocks 13 and 15 are placed on top, and tightened by means of setscrews 17 and 18 so that the cathode expansion is not effected. If necessary, the setscrews can be loosened after tightening by a certain angle. It is also possible to replace the setscrews by centering pins with play, so that contact is accomplished solely by the weight of the blocks 13 and 15. The bores 40 and 41 can accommodate possible burr-like deformations at the ends of cathode 10 so that the latter may not hinder the lengthwise expansion of the cathode.

FIG. 5 shows a second accelerator 42 which is at ground potential and is aligned parallel to the beam exit end of the clamps 11 and 12. The second accelerator is held in grooves 43 and 44 by side pieces which are fastened to a ground plate 24. The second accelerator also has a beam exit opening 47 which is essentially congruent with the beam exit opening 33.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An arrangement in an electron beam generator comprising, in combination, a directly heatable linear cathode; metal clamps for clamping said cathode at at least one end so that said cathode is movable longitudinally; a beam-forming electrode at substantially the same potential as said cathode; connection means on said beam-forming electrode and supplying beam and heater voltage to said cathode; said beam-forming electrode having an exit opening for the electron beam, said metal clamps comprising connection contacts for the ends of said cathode, said metal clamps being outside the contact points in the emission area of the cathode and having recesses for forming said beam-forming electrode with said exit opening, said metal clamps comprising electrical contacts for conducting current through said cathode to heat said cathode, said metal clamps for both ends of said cathode being separated by an insulating plane.

2. An arrangement in an electron beam generator as defined in claim 1 wherein said clamps comprise two parallelepiped-shaped blocks held relative to one another and combined in an assembly so that said blocks are separated only by a plane of separation, at least one of said blocks having a groove-shaped recess for holding said end of said cathode at the clamping location of said cathode.

3. The arrangement in an electron beam generator as defined in claim 2 wherein said blocks are recessed at four corners facing one another to constitute a Wehnelt electrode.

4. The arrangement in an electron beam generator as defined in claim 3 wherein said blocks are subdivided into quadrants by planes of separation extending perpendicular to said first-mentioned plane of separation, said first-mentioned plane of separation extending at right angles to said cathode in the center of the emission region thereof.

5. The arrangement in an electron beam generator as defined in claim 4 wherein said planes of separation extending perpendicular to the first-mentioned plane of separation are horizontal planes.

6. The arrangement in an electron beam generator as defined in claim 2 wherein said groove-shaped recess has an enlarged cross-section in proximity of said cathode end.

7. An arrangement in an electron beam generator as defined in claim 1 wherein said clamps comprise two parallelepiped-shaped blocks held relative to one another and combined in an assembly so that said blocks are separated only by a plane of separation, at least one of said blocks having a groove-shaped recess for holding said end of said cathode at the clamping location of said cathode; said blocks being recessed at four corners facing one another to constitute a Wehnelt electrode; said blocks being subdivided into quadrants by planes of separation extending perpendicular to said first-mentioned plane of separation, said first-mentioned plane of separation extending at right angles to said cathode in the center of the emission region thereof; said planes of separation extending perpendicular to the first-mentioned plane of separation being horizontal planes; said groove-shaped recess having an enlarged cross-section in proximity of said cathode end.

* * * * *